United States Patent
Louco et al.

(10) Patent No.: US 11,512,626 B2
(45) Date of Patent: Nov. 29, 2022

(54) ELECTRIC POWER DISSIPATER FOR ELECTRICALLY-ACTUATED TURBOCHARGER

(71) Applicant: BorgWarner Inc., Auburn Hills, MI (US)

(72) Inventors: Lathom Alexander Louco, Arden, NC (US); Jeffrey Carter, West Yorkshire (GB)

(73) Assignee: BORGWARNER, INC., Auburn Hills, MI (US)

( * ) Notice: Subject to any disclaimer, the term of this patent is extended or adjusted under 35 U.S.C. 154(b) by 0 days.

(21) Appl. No.: 17/317,135

(22) Filed: May 11, 2021

(65) Prior Publication Data

US 2021/0348549 A1  Nov. 11, 2021

Related U.S. Application Data

(60) Provisional application No. 63/022,599, filed on May 11, 2020.

(51) Int. Cl.
*F02B 39/10* (2006.01)
*F01D 25/12* (2006.01)
(Continued)

(52) U.S. Cl.
CPC .............. *F02B 39/10* (2013.01); *F01D 21/00* (2013.01); *F01D 25/12* (2013.01); *F01D 25/16* (2013.01);
(Continued)

(58) Field of Classification Search
CPC .......... F02B 39/10; F01D 21/00; F01D 25/12; F01D 25/16; F01D 15/10; F05D 2220/40;
(Continued)

(56) References Cited

U.S. PATENT DOCUMENTS 6,299,261 B1  10/2001  Weiberle et al.
7,014,586 B2   3/2006  Randall
(Continued)

FOREIGN PATENT DOCUMENTS

CN   102770634 A   11/2012
EP     2634405 A1   9/2013
(Continued)

OTHER PUBLICATIONS

Chinese Office Action for Chinese Application No. 202121001875.5 dated Oct. 11, 2021 (1 page).
(Continued)

*Primary Examiner* — J. Todd Newton
(74) *Attorney, Agent, or Firm* — Reising Ethington P.C.

(57) ABSTRACT

An electric power dissipater assembly for an electrically-actuated turbocharger that includes: a power switch configured to be electrically connected to an electric power output of an electrically-actuated turbocharger; at least one resistor that is electrically connected to the power switch such that, when the power switch is in a closed position and connected to the electric power output, the at least one resistor is electrically coupled to the electric power output so that electric power provided by the electrical power output is received at and dissipated by the at least one resistor; a controller that controls whether the power switch is in the closed position or an open position; and a substrate that is physically coupled to the at least one resistor and that includes a coolant path that is used to cool the at least one resistor when coolant is received within the coolant path.

20 Claims, 8 Drawing Sheets

(51) Int. Cl.
*H05K 1/02* (2006.01)
*F01D 25/16* (2006.01)
*F01D 21/00* (2006.01)

(52) U.S. Cl.
CPC .......... *H05K 1/02* (2013.01); *F05D 2220/40* (2013.01); *F05D 2250/231* (2013.01); *F05D 2260/232* (2013.01); *F05D 2270/304* (2013.01); *F05D 2270/52* (2013.01)

(58) Field of Classification Search
CPC ......... F05D 2250/231; F05D 2260/232; F05D 2270/304; F05D 2270/52; F05D 2260/79
See application file for complete search history.

(56) References Cited

U.S. PATENT DOCUMENTS

| | | | |
|---|---|---|---|
| 8,143,732 B2 | 3/2012 | Algrain | |
| 8,584,459 B2 | 11/2013 | Richards | |
| 8,847,524 B2 * | 9/2014 | Mazumdar | B60L 7/06 318/362 |
| 10,319,665 B2 * | 6/2019 | Maruyama | H01L 25/18 |
| 10,462,937 B1 * | 10/2019 | Louco | H05K 1/183 |
| 2002/0124565 A1 | 9/2002 | Tsuji | |
| 2003/0158638 A1 * | 8/2003 | Yakes | G07C 5/008 180/65.245 |
| 2012/0244011 A1 | 9/2012 | Costall | |
| 2013/0213350 A1 | 8/2013 | Watanabe et al. | |
| 2016/0268867 A1 * | 9/2016 | Mackowiak | B60W 20/10 |
| 2019/0368413 A1 * | 12/2019 | Carter | H05K 7/20872 |
| 2020/0191014 A1 * | 6/2020 | Garrard | F01D 25/12 |
| 2021/0087967 A1 * | 3/2021 | Louco | F02B 37/10 |
| 2021/0348549 A1 * | 11/2021 | Louco | F01D 25/16 |

FOREIGN PATENT DOCUMENTS

| | | |
|---|---|---|
| JP | H0598987 A | 4/1993 |
| KR | 1 00878661 B1 | 1/2009 |

OTHER PUBLICATIONS

English Translation of Chinese Office Action for Chinese Application No. 202121001875.5 dated Oct. 11, 2021 (2 pages).

* cited by examiner

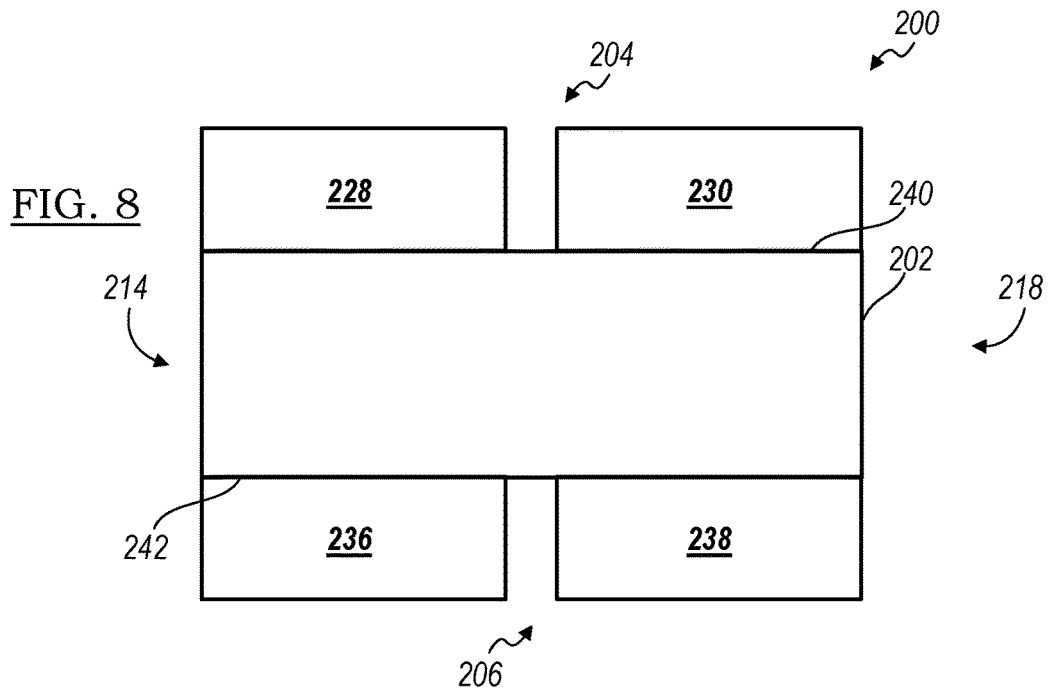
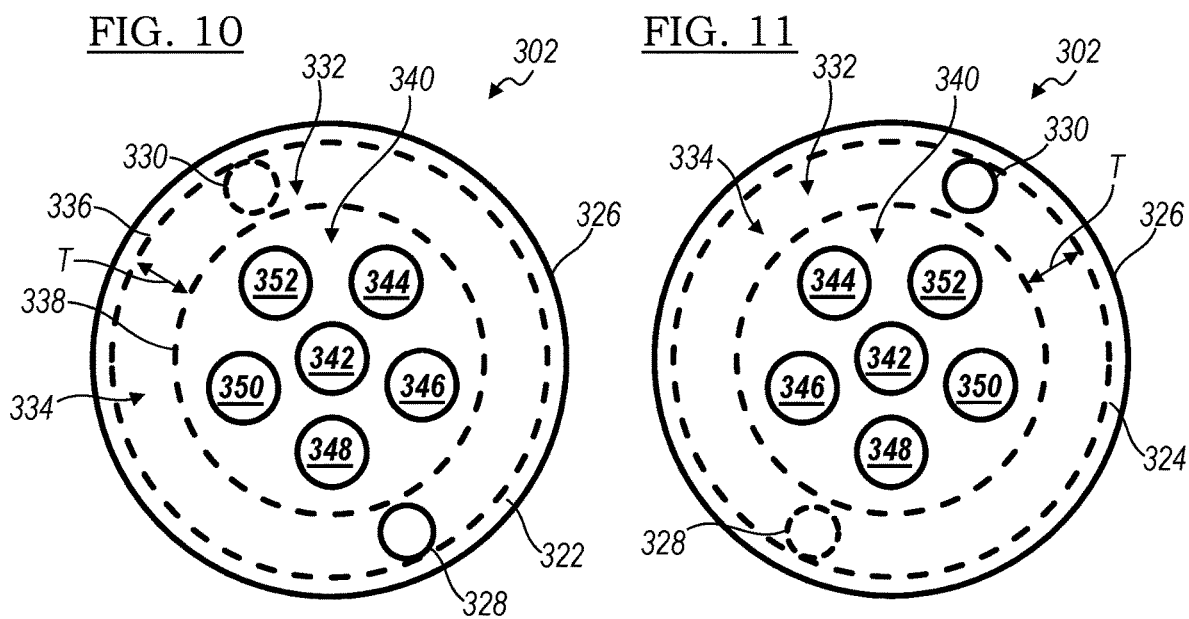

> US 11,512,626 B2

ELECTRIC POWER DISSIPATER FOR ELECTRICALLY-ACTUATED TURBOCHARGER

TECHNICAL FIELD

The present application relates to electrically-actuated turbochargers and, more particularly, to power management for electrically-actuated turbochargers.

BACKGROUND

Internal combustion engines (ICEs) combine fuel, spark, and an intake of ambient air to create a combustion event that repeatedly moves pistons in a way to forcibly rotate a crankshaft. Fuel and spark are introduced into a combustion chamber at one end of a cylinder within which the piston moves reciprocatively. As fuel and spark are delivered to the combustion chamber in the presence of ambient air, combustion occurs and forces the piston away from the combustion chamber thereby converting that force into rotational energy through the crankshaft. The power of an ICE can be increased for a given quantity of fuel and spark using the forced induction of ambient air into the combustion chambers via turbochargers. Turbochargers include a compressor and an exhaust turbine that were mechanically linked via a common shaft. Turbochargers receive exhaust gas generated by the ICE and the flow of that gas rotates the exhaust turbine as well as the compressor compressing air ultimately introduced to the intake of the ICE.

Turbochargers compress air that is introduced to the intake of the ICE using the flow of exhaust gas. But modern ICEs increasingly use electrically-actuated turbochargers for forced induction. Electrically-actuated turbochargers use an electric motor to turn a compressor that can be solely powered by the electric motor or by both the electric motor and an exhaust turbine. Power electronics are used to control the electric motor used with the electrically-actuated turbocharger. However, sometimes too much energy is placed on the turbine wheel of the turbocharger thereby causing the turbocharger to over-speed. Such an over-speeding event can lead to failure of the turbocharger, which could result in damage to the turbocharger and/or nearby components of the vehicle in which the turbocharger is installed. Also, in some instances, the electrically-actuated turbocharger can operate at a speed at which the electrically-actuated turbocharger generates too much electric power, and this excess electric power can adversely affect the power electronics and/or other components to which they are electrically coupled. It would be helpful to manage excess power generated by the electrically-actuated turbocharger.

SUMMARY

In one implementation, an electric power dissipater assembly for an electrically-actuated turbocharger includes: a power switch configured to be electrically connected to an electric power output of an electrically-actuated turbocharger; at least one resistor that is electrically connected to the power switch such that, when the power switch is in a closed position and connected to the electric power output, the at least one resistor is electrically coupled to the electric power output so that electric power provided by the electrical power output is received at and dissipated by the at least one resistor; a controller that is electronically coupled to the power switch such that the controller controls whether the power switch is in the closed position or an open position; and a substrate that includes an inlet port, an outlet port, and a coolant path that extends from the inlet port to the outlet port, wherein the substrate is physically coupled to the at least one resistor such that the at least one resistor is cooled when coolant is received within the coolant path.

In another implementation, an electric power dissipater assembly for an electrically-actuated turbocharger includes: a power switch configured to be electrically connected to an electric power output of an electrically-actuated turbocharger; at least one resistor that is electrically connected to the power switch such that, when the power switch is in a closed position and connected to the electric power output, the at least one resistor is electrically coupled to the electric power output so that electric power provided by the electrical power output is received at and dissipated by the at least one resistor; a controller that is electronically coupled to the power switch such that the controller controls whether the power switch is in the closed position or an open position; and a substrate, including an inlet port, an outlet port, and a coolant path, having a radial thickness at least partially defining the coolant path, wherein the substrate is physically coupled to the at least one resistor such that the at least one resistor is cooled when coolant is received within the coolant path, and wherein the at least one resistor is positioned radially-inwardly relative to the radial thickness.

BRIEF DESCRIPTION OF THE DRAWINGS

FIG. 8 is a rear view of the second resistor-substrate configuration of FIG. 6;

FIG. 10 is a front view of the substrate of the third resistor-substrate configuration of FIG. 9;

FIG. 11 is a rear view of the substrate of the third resistor-substrate configuration of FIG. 9;

DETAILED DESCRIPTION

Figure 1:
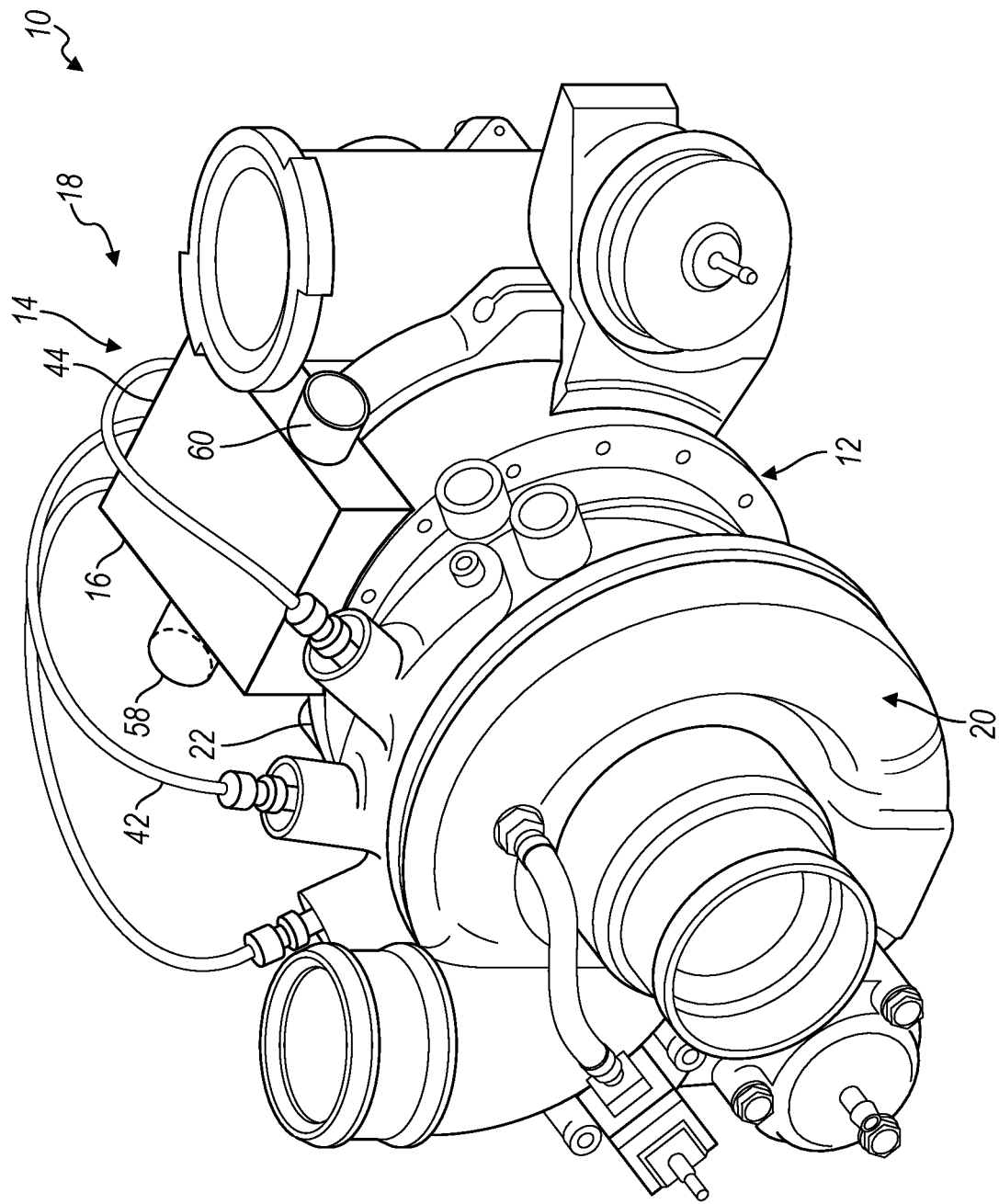
FIG. 1 is a perspective view depicting an implementation of an electrically-actuated turbocharger assembly.

There is provided an electric power dissipater assembly and method that enables excess power generated by an electrically-actuated turbocharger to be dissipated and converted into heat by at least one resistor of the electric power dissipater assembly. In addition to the at least one resistor, the electric power dissipater assembly generally includes a power switch, a controller, and a substrate through which a coolant path is provided and that is physically coupled to that at least one resistor. The power switch is configured to be electrically connected to an electric power output of the electrically-actuated turbocharger and to the at least one resistor so that, when the power switch is in a closed position, the electric power output is electrically connected to the at least one resistor. The controller is used for controlling the position of the power switch between the closed position and an open position.

When the power switch is closed, heat may be generated by the at least one resistor as it dissipates electric power. The at least one resistor is cooled by coolant flowing through the coolant path of the substrate to which the at least one resistor is physically coupled. The cooling path of the substrate connects an inlet port to an outlet port and is configured to allow coolant to enter the coolant path via the inlet port and to flow through the coolant path and out via the outlet port. In one embodiment, the inlet port is configured to be in fluid communication with a turbocharger liquid coolant path that is provided within the electrically-actuated turbocharger so as to cool a portion of the electrically-actuated turbocharger. In another embodiment, the inlet port is configured to be in fluid communication with an intake flow path of a compressor of the turbocharger so that air drawn into the intake flow path is used to cool the at least one resistor.

In one embodiment, the controller is used to switch the power switch from the open position to the closed position in response to receiving an indication of an over-speeding event, which is an event in which a shaft speed of the turbocharger is above a predetermined amount. To mitigate the effects of over-speeding, the controller switches the power switch to the closed position, which then causes electric power generated by the electrically-actuated turbocharger to be received at and dissipated by the at least one resistor. In some embodiments, one or more additional conditions may be used as a basis for determining whether to switch the power switch to the closed position, such as a current state of charge of a vehicle battery and threshold charge amount of the vehicle battery to which the electric power output is connected. In one embodiment, a second controller of the vehicle may determine that the vehicle battery is no longer able to accept more charge (from the electrically-actuated turbocharger) and, if so, the second controller may send a control signal to the controller indicating that no more charge is able to be accepted by the vehicle battery. This may be used as a basis for determining whether to switch the power switch to the closed position.

Figure 2:
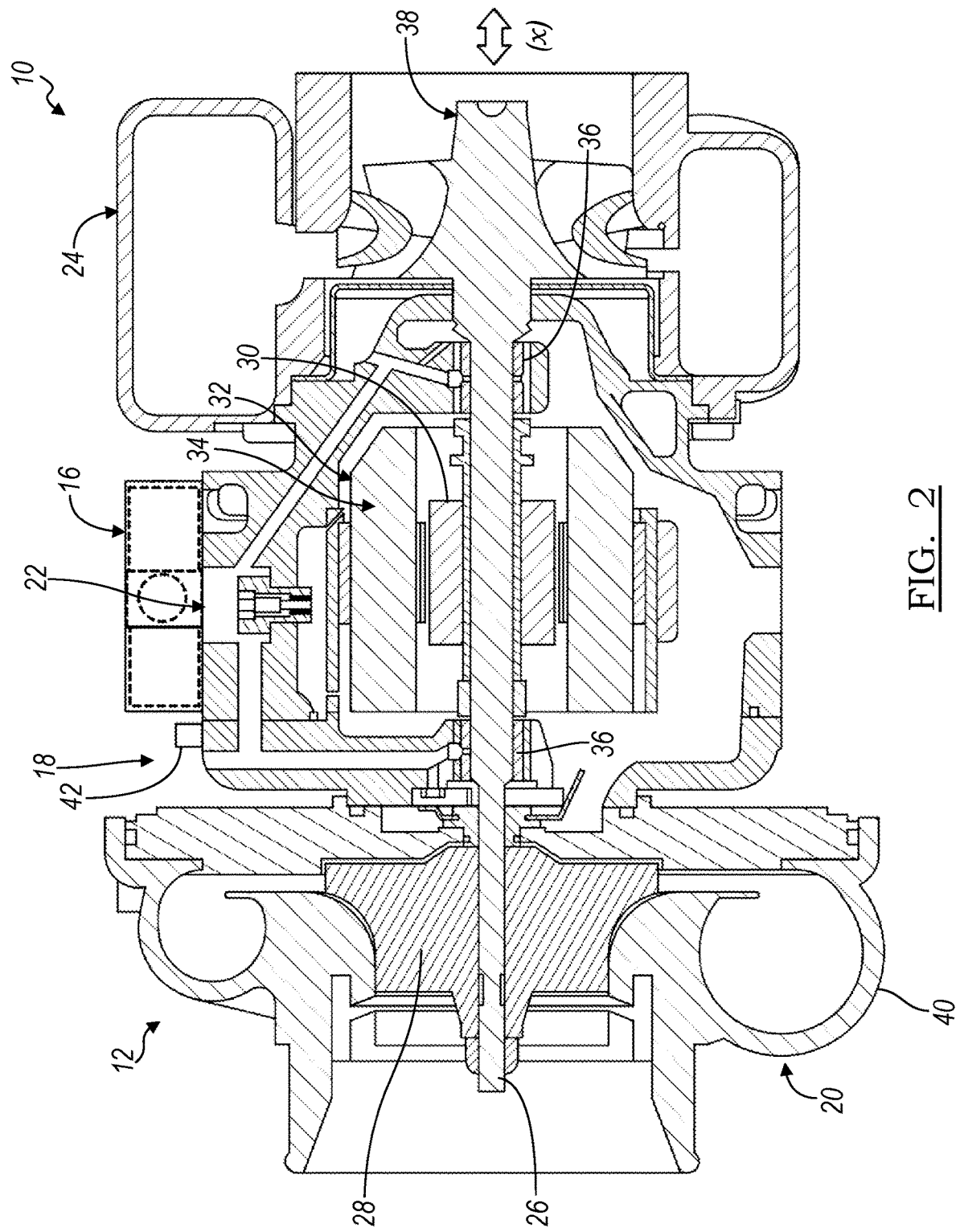
FIG. 2 is a cross-sectional view of the electrically-actuated turbocharger assembly of FIG. 1.

FIGS. 1-2 depict one implementation of an electrically-actuated turbocharger assembly 10 that includes an electrically-actuated turbocharger 12 and an electric power dissipater assembly 14 that is included in a housing 16, which is mounted on a turbocharger housing 18. The housing 16 may be mounted to the turbocharger housing 18 in a variety of ways in addition to that which is shown in FIG. 1. For example, the housing 16 may be rotated 90° so that a peripheral side of the housing 16 contacts the turbocharger housing 18.

The electrically-actuated turbocharger 12 includes a compressor portion 20, an electric motor portion 22, and an exhaust portion 24. A turbine shaft 26 extends through the compressor portion 20, the electric motor portion 22, and the exhaust portion 24 as can be appreciated in FIG. 2. At one end, the turbine shaft 26 couples with a compressor 28, located in the compressor portion 20, that spins to compress air, which is ultimately supplied to an intake plenum (not shown) of an internal combustion engine (ICE). Another portion of the turbine shaft 26 that is axially-spaced from the compressor 28 and located in the electric motor portion 22 couples with a rotor assembly 30 of an electric motor 32. The rotor assembly 30 can be positioned concentrically relative to a stator 34 included in the electric motor portion 22. One or more bearings 36 are included in the electric motor portion 22 and axially spaced along the turbine shaft 26 to support and stabilize the turbine shaft 26, the compressor 28, the rotor assembly 30, and an exhaust turbine 38 as these elements rotate within the turbocharger 12 during operation. The exhaust turbine 38 is coupled to an end of the turbine shaft 26 distal to the compressor 28 located in the exhaust portion 24.

The compressor portion 20 includes a compressor chamber 40 in which the compressor 28 spins in response to the rotation of the turbine shaft 26 and compresses air that is ultimately supplied to the intake manifold of the ICE. The compressor 28 is coupled with the turbine shaft 26 that extends from the compressor portion 20 into the electric motor portion 22 and the exhaust portion 24. The rotor assembly 30 is coupled to the turbine shaft 26 so that the rotor assembly 30 and the turbine shaft 26 are not angularly displaced relative to each other. When combined, the rotor assembly 30 extends axially relative to the shaft 24 in close proximity to the stator 34. The stator 34 can include a plurality of windings that convey electrical current from the power electronics and induce the angular displacement of the rotor assembly 30 and the turbine shaft 26 coupled to the rotor assembly 30 relative to the stator 34. The compressor chamber 40 is in fluid communication with a compressor inlet that draws air from the surrounding atmosphere and supplies it to the compressor 26. As current is provided to the windings of the stator 34, the rotor 30 is induced to rotate and impart that rotation on the turbine shaft 26 and the compressor 28.

In one implementation, the stator 34 and the rotor 30 can be implemented as a direct current (DC) brushless motor that receives DC voltage from a vehicle battery (not shown). The amount of DC voltage applied to the stator 34 may be greater than 40 volts (V), such as can be provided by a modern 48V vehicle electrical system. Other implementations are possible in which a vehicle electrical system uses higher voltages, such as 400V and 800V.

An electric power output 42 is used to electrically connect the vehicle battery to the electric motor so as to charge the vehicle battery. According to various embodiments, the electric power output 42 may be electrically connected to various other electric components. The electric power output 42 is also connected to a power switch 44 of the electric power dissipater assembly 14, as shown in FIG. 3.

Figure 3:
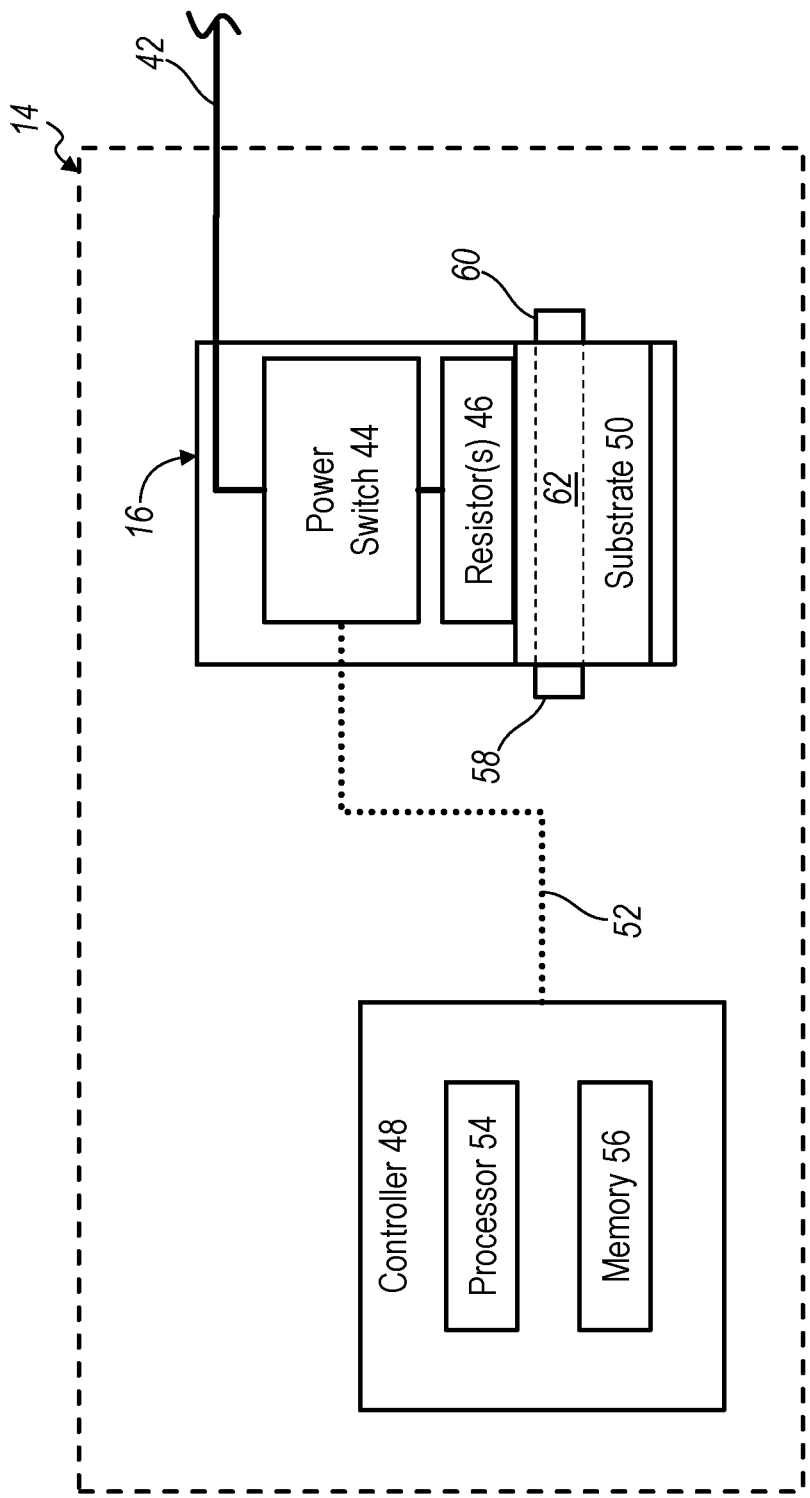
FIG. 3 is a diagrammatic view depicting an implementation of an electric power dissipater assembly.

FIG. 3 depicts the electric power dissipater assembly 14, which includes the power switch 44, at least one resistor 46, a controller 48, and a substrate 50. In the illustrated embodiment of FIG. 3, the housing 16 of the electric power dissipater assembly 14 includes the power switch 44, the at least one resistor 46, and the substrate 50. However, according to other embodiments, the power switch 44 may be located outside the housing 16 and/or the controller 48 may be located within the housing 16.

The power switch 44 is configured to be electrically connected to the electric power output 42 of the electrically-actuated turbocharger 12. Further, the power switch 44 is electrically connected to the at least one resistor 46 such that, when the power switch 44 is in a closed position, electric power provided by the electric power output 42 is received at and dissipated by the at least one resistor 46. In this way, the power switch 44 is used to control whether electric power generated by the electric motor 32 is dissipated into heat by the at least one resistor 46 or used for other purposes, such as to charge the vehicle battery.

The power switch 44 may be an electronically-controlled switch that is provided within an electrical path between the electric power output 42 and the at least one resistor 46 as shown by the solid line. The power switch 44 is electronically controlled by the controller 48 between an open position and a closed position and, in the illustrated embodiment, the controller 48 controls the power switch 44 by sending control signals to the power switch 44 via an electronic control signal path 52. The power switch 44 may be any suitable electric switch that is electronically-controllable between the open and the closed position. The power switch 44 can be a Metal Oxide Semiconductor Field-Effect Transistor (MOSFET) or a Bipolar Junction Transistor (BJT) having a gate that receives a logic signal from the processor 54. It should be appreciated that the power switch 44 is considered to be in the open position when the power switch 44 is in a state that is not used to electrically connect the electric power output 42 to the at least one resistor 46 and considered to be in the closed position when the power switch 44 is in a state that is used to electrically connect the electric power output 42 to the at least one resistor 46.

The at least one resistor 46 includes one or more resistors that are used to dissipate electric power into heat. Any of a variety of suitable resistors may be used, such as, for example, a TAP800 Series™ 800 Watt Heat Sinkable Planar resistor manufactured by Ohmite™. In embodiments where a plurality of resistors are used as the at least one resistor 46, each of the plurality of resistors may or may not be the same as each other and may be connected to each other and/or the power switch 44 in a variety of ways. The at least one resistor 46 is physically coupled to the substrate 50 so that heat is drawn away from the at least one resistor 46.

The controller 48 is used to electronically control the power switch 44 between the open position and the close position. In the illustrated embodiment, the controller 48 is not included in the housing 16 of the electric power dissipater assembly 14, but is electronically coupled to the power switch 44 via the electronic control signal path 52 as shown in FIG. 3. According to other embodiments, the controller 48 may be included within the housing 16 along with the at least one resistor 46 and the substrate 50.

The controller 48 includes a processor 54 and memory 56. The controller 48 may be used to control the state of the power switch 44 through sending control signal(s) to the power switch 44 via the electronic control signal path 52. The processor 54 may be any suitable processing unit or electronic circuit, such as application specific integrated circuits (ASICs), field-programmable gate arrays (FPGAs), central processing unit (CPU), etc. In one embodiment, the memory 56 stores computer instructions that, when executed by the processor 54, cause one or more steps of the method discussed below to be carried out. Moreover, it should be appreciated that the controller 48 need not be solely dedicated to carrying out functionality related to the method discussed below, as in some embodiments, the controller 48 may be used to carry out other functionality of the turbocharger assembly 10 and/or that of other systems in which the turbocharger assembly 10 is used.

The substrate 50 includes an inlet port 58, an outlet port 60, and a coolant path 62 that extends from the inlet port 58 to the outlet port 60. The substrate 50 is physically coupled to the at least one resistor 46 such that the at least one resistor 46 is cooled when coolant is received within the coolant path 62. The substrate 50 may be comprised of a variety of suitable materials, such as those used for passive heat sinks. For example, the substrate 50 may be made of an aluminum or copper alloy.

The inlet port 58 and the outlet port 60 may be configured to be in fluid communication with any of a variety of fluid communication paths that include a coolant, such as a liquid coolant (e.g., liquid water, engine oil) or a gas coolant (e.g., air). In one embodiment, the inlet port 58 and/or the outlet port 60 are configured to be in fluid communication with a turbocharger liquid coolant path that is provided within the electrically-actuated turbocharger 12 so as to cool a portion of the electrically-actuated turbocharger 12, which may be, for example, water that cools the bearing housing. In another embodiment, the inlet port 58 and/or the outlet port 60 are configured to be in fluid communication with an intake flow path of the compressor 28 so that air drawn into the intake flow path is used to cool the at least one resistor 46.

With reference to FIGS. 4-13, there are shown various resistor-substrate configurations 100,200,300,300' that each include at least one resistor and a substrate. These resistor-substrate configurations 100,200,300,300' can be implemented as the at least one resistor 46 and the substrate 50 of the above-described electric power dissipater assembly 14.

Figure 4:
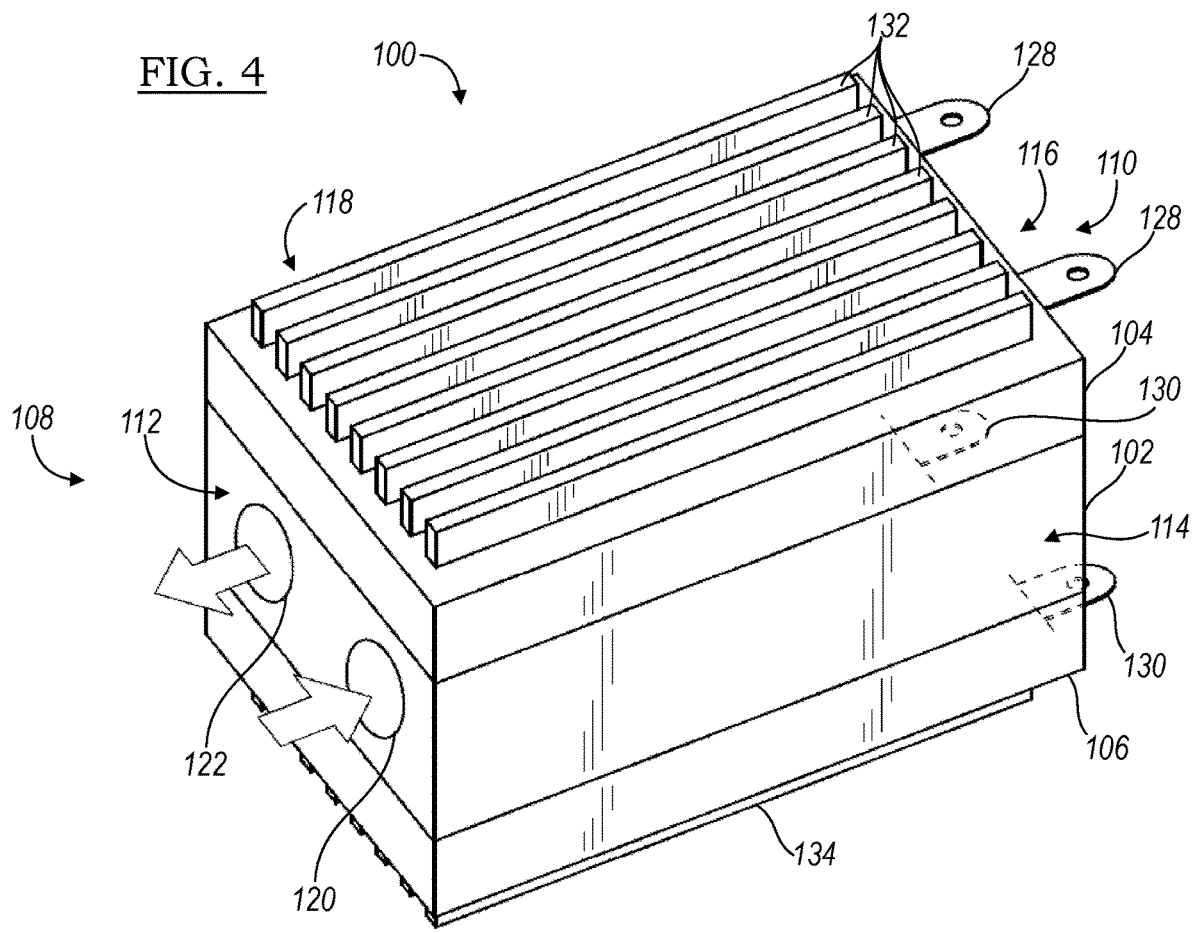
FIG. 4 is a perspective view depicting a first resistor-substrate configuration that can be used as a part of an electric power dissipater assembly.
Figure 5:
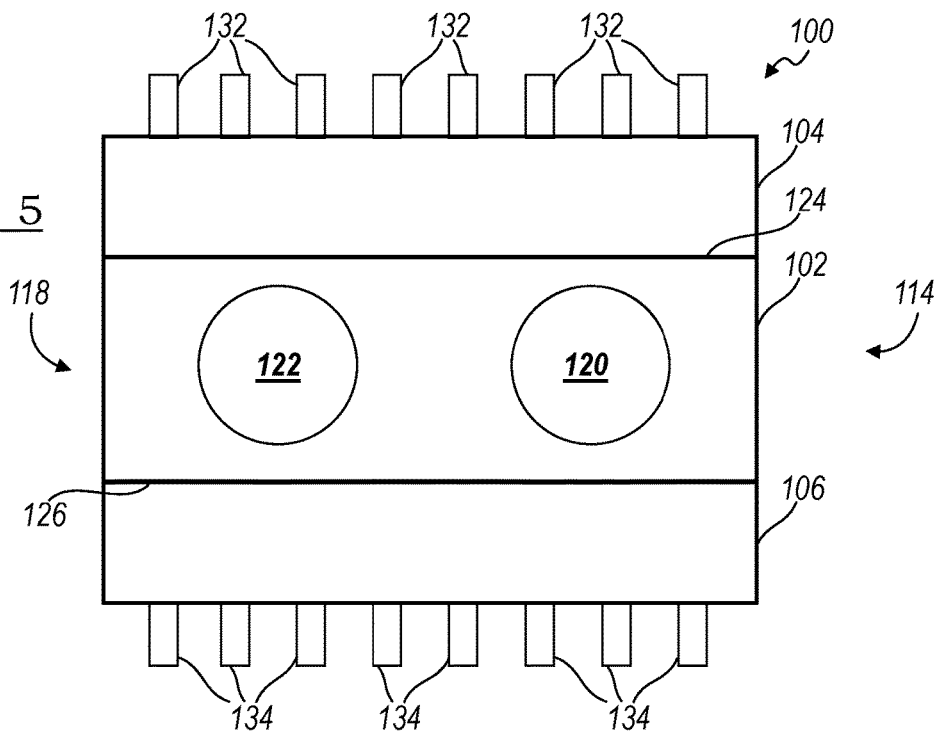
FIG. 5 is a front view of the first resistor-substrate configuration of FIG. 4.

With reference to FIGS. 4-5, a first resistor-substrate configuration 100 is shown that may be implemented as a part of the electric power dissipater assembly 14. The first resistor-substrate configuration 100 includes a substrate 102 that is provided between a first resistor 104 and a second resistor 106 in a sandwich-like manner. The first resistor-substrate configuration 100 is generally cuboid-shaped and includes a first end 108 and a second end 110 that opposes the first end 108. The first resistor-substrate configuration 100 also includes four peripheral sides 112,114,116,118, and the substrate 102 includes an inlet port 120 and an outlet port 122 that are both provided at the first end 108 and are disposed on the substrate 102 at the first peripheral side 112.

The substrate 102 includes a coolant path (not shown) that extends through the substrate 102 from the inlet port 120 to the outlet port 122. In one embodiment, the coolant path extends from the inlet port 120 at the first end 108 toward the second end 110 and then back towards the outlet port 122 at the first end 108. In this way, coolant provided within the coolant path is used to cool the first resistor 104 and the second resistor 106 at both the first end 108 and the second end 110.

The substrate 102 includes a top surface or side 124 and a bottom surface or side 126 that opposes the top surface 124. The first resistor 104 is physically coupled and fixed to the top surface 124 of the substrate 102 and the second resistor 106 is physically coupled and fixed to the bottom surface 126. The first resistor 104 and the second resistor 106 may be fixed to the top surface 124 and the bottom surface 126, respectively, using any one or more of adhesive(s), bolts, screws, rivets, hook and loop fasteners, resilient locking tabs or mechanisms, etc.

The first resistor 104 and the second resistor 106 each include electrical connectors 128,130 (only one connector 130 shown for the second resistor 106). The electrical connectors 128,130 are each formed as a metal tab that has a rounded end that includes a through-hole to facilitate connection to an electric wire (or other electric component). The connectors 128,130 are used to electrically connect the first and second resistors 104,106 to the power switch 44. The connectors 128,130 are provided at the second end 110 on the first and second resistors 104,106 along the third peripheral side 116, which is a peripheral side of the first resistor-substrate configuration 100 that opposes the first peripheral side 112. A plurality of heat dissipation fins 132,134 are provided on an exposed surface of the first and second resistors 104,106 such that the plurality of heat dissipation fins 132,134 extend away from the substrate 102. The plurality of heat dissipation fins 132,134 are used to dissipate heat generated by the first and second resistors 104,106 so as to cool the first and second resistors 104,106.

Figure 6:
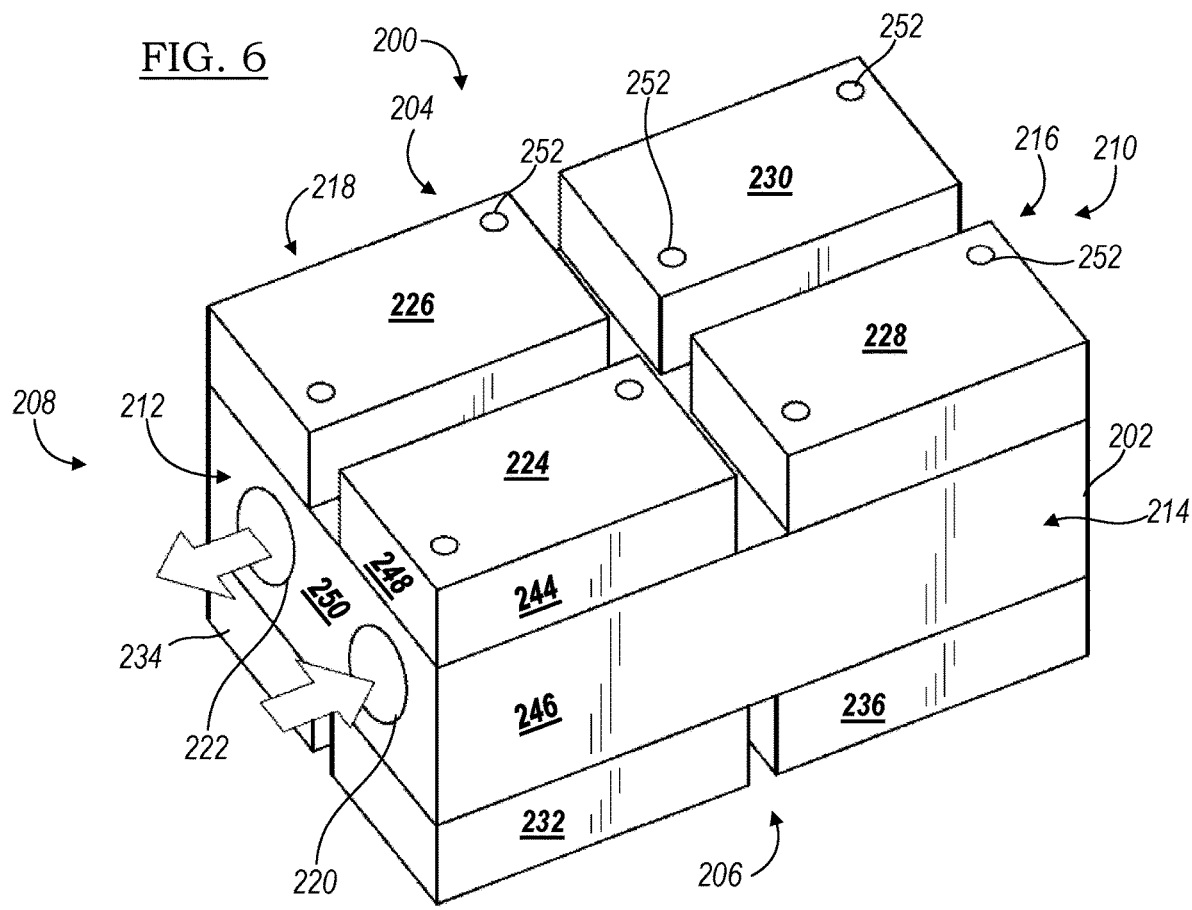
FIG. 6 is a perspective view depicting a second resistor-substrate configuration that can be used as a part of an electric power dissipater assembly.
Figure 7:
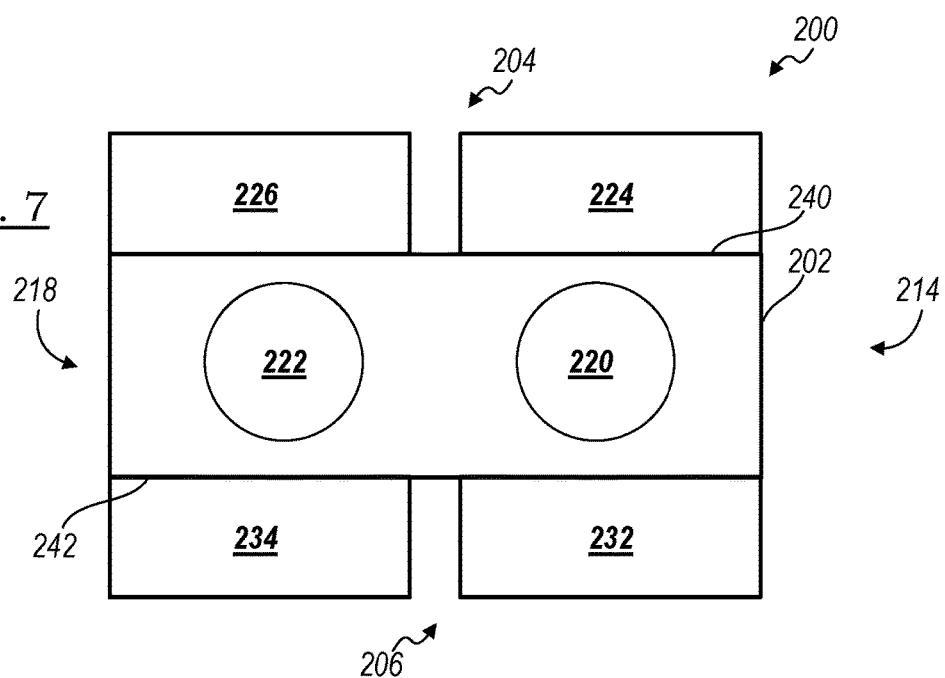
FIG. 7 is a front view of the second resistor-substrate configuration of FIG. 6.

With reference to FIGS. 6-8, a second resistor-substrate configuration 200 is shown that may be used as a part of the electric power dissipater assembly 14. The second resistor-substrate configuration 200 includes a substrate 202 that is provided between a first set of resistors 204 and a second set of resistors 206. The second resistor-substrate configuration 200 includes a first end 208 and a second end 210 that opposes the first end 208. The first resistor-substrate configuration 200 also includes four peripheral sides 212,214, 216,218, and the substrate 202 includes an inlet port 220 and an outlet port 222 that are both provided at the first end 208 and are disposed on the substrate 202 at the first peripheral side 212.

The substrate 202 includes a coolant path (not shown) that extends through the substrate 202 from the inlet port 220 toward the outlet port 222. In one embodiment, the coolant path extends from the inlet port 220 at the first end 208 toward the second end 210 and then back towards the outlet port 222 at the first end 208. In this way, coolant provided within the coolant path is used to cool the first resistor 204 and the second resistor 206 at both the first end 208 and the second end 210.

The first set of resistors 204 includes four resistors 224,226,228,230 and the second first set of resistors 206 includes four resistors 232,234,236,238. The substrate 202 includes a top surface or side 240 and a bottom surface or side 242 that opposes the top surface 240. Each of the four resistors 224-230 are physically coupled and fixed to the top surface 240 of the substrate 202 and each of the four resistors 232-238 are physically coupled and fixed to the bottom surface 242 using any one or more of adhesive(s), bolts, screws, rivets, hook and loop fasteners, resilient locking tabs or mechanisms, etc. Each of the resistors 224-238 of the first set of resistors 204 and the second set of resistors 206 is aligned with the substrate 202 such that each resistor 224-238 has two peripheral surfaces that are flush with two peripheral surfaces of the substrate 202. For example, the first resistor 224 has a first peripheral surface 244 that is flush with a first peripheral surface 246 of the substrate 202 and has a second peripheral surface 248 that is flush with a second peripheral surface 250 of the substrate 202.

Each of the resistors 224-238 of the first set of resistors 204 and the second set of resistors 206 includes two connectors 252 that are used to connect the resistor to the power switch 44. The connectors 252 are provided on a surface of the resistor 224-238 that opposes the surface of the resistor 224-238 that is attached to the substrate 202. For example, the connectors 252 of the first set of resistors 204 are provided on a surface facing upward and away from the substrate 202 and the connectors 252 of the second set of resistors 206 are provided on a surface facing downward and away from the substrate 202.

Figure 9:
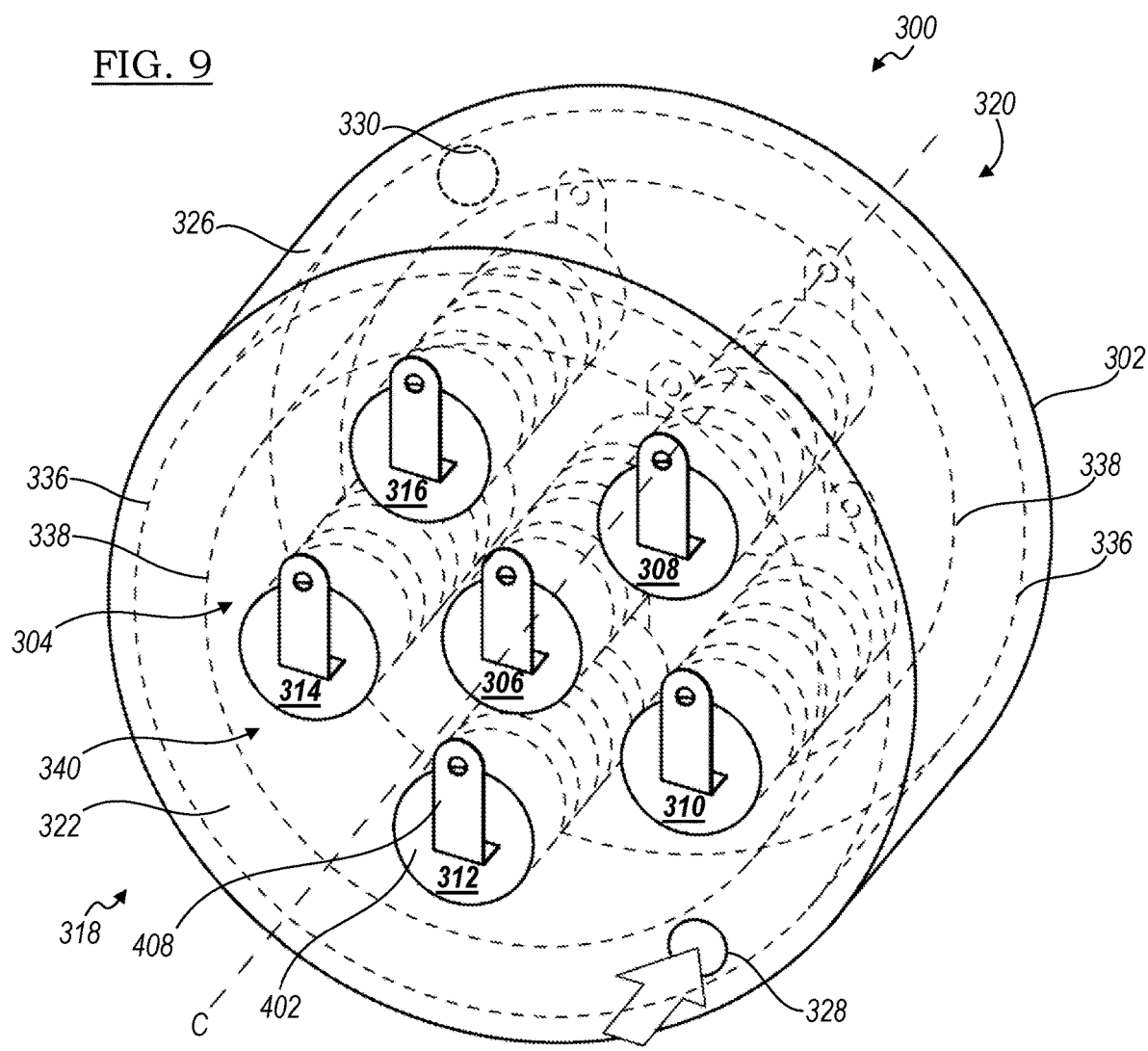
FIG. 9 is a perspective view depicting a third resistor-substrate configuration that can be used as a part of an electric power dissipater assembly.

With reference to FIGS. 9-11, a third resistor-substrate configuration 300 is shown that may be used as a part of the electric power dissipater assembly 14. The third resistor-substrate configuration 300 includes a substrate 302 that is cylindrical and that is physically coupled to a plurality of resistors 304, namely six resistors 306,308,310,312,314, 316. The third resistor-substrate configuration 300, as well as each of the resistors 306-316 and the substrate 302, are cylindrical and extend from a first end 318 to a second end 320 that opposes the first end 318. The substrate 302 includes a first axial end wall 322 located at the first end 318 and a second axial end wall 324 located at the second end 320. The substrate 302 also includes a circumferential wall 326 that extends from the first end 318 to the second end 320.

An inlet port 328 is provided at the first end 318 and an outlet port 330 is provided at the second end 320. The inlet port 328 includes a cylindrical through-hole extending through the first axial end wall 322 to a portion of a coolant path 332 located at or near the first end 318 and the outlet port 330 includes a cylindrical through-hole extending through the second axial end wall 324 to a portion of the coolant path 332 located at or near the second end 320. The coolant path 332 includes a sleeve portion 334 that has an annular shape about a central axis C and is defined by a radially-inward-facing surface 336 and a radially-outward-facing surface 338. The radially-inward-facing surface 336 is an inner surface of the outer circumferential wall 326 and the radially-outward-facing surface 338 is an outer surface of an inner portion 340 of the substrate 302. FIGS. 10-11 depict the substrate 302 and show the thickness T of the sleeve portion 334, which corresponds to the difference between the radius of the radially-inward-facing surface 336 minus the radius of the radially-outward-facing surface 338 taken with respect to the central axis C.

In other embodiments, instead of the sleeve portion 334 having an annular shape that extends from the first end 318 to the second end 320, the coolant path 332 may have a helically-shaped portion (centered around the central axis 6) that extends from the first end 318 to the second end 320 and, in one embodiment, the coolant path 332 may have a double, triple, etc., helically-shaped portion that includes multiple helically-shaped paths extending from the first end 318 to the second end 320. In another embodiment, the coolant path 332 may extend from a first radial-outer position (such as where the inlet port 328 is located) to a radial-inner position (such as a position located along the central axis C), then to a second radial-outer position (such as a position that is located opposite the central axis C from the first position but with the same radial extent), and then back to the radial-inner position. The coolant path 332 may extend a number of times in this snake-like manner before reaching the outlet port 330.

The inner portion 340 is cylindrical, centered along the central axis C, and the outer surface disposed radially-inward, with respect to the central axis C, from the sleeve portion 334. The inner portion 340 extends from the first axial end wall 322 to the second axial end wall 324. The inner portion 340 includes a plurality of cavities 342-352 that are each cylindrical and each configured to receive a resistor. Each of the plurality of cavities extends from an opening in the first axial end wall 322 to an opening in the second axial end wall 324. A first cavity 342 of the plurality of cavities 342-352 is centered along the central axis C and the remaining five cavities 344-352 are equally spaced away from the central axis and from one another.

As shown in FIG. 9, the third resistor-substrate configuration 300 includes six resistors 306-316, each of which is provided in a single one of the plurality of cavities 342-352. In one embodiment, the plurality of cavities 342-352 may be sized so as to receive and snuggly hold onto the resistors 306-316. Additionally or alternatively, an adhesive may be applied to the outer surface of the resistors 306-316 and/or to the surfaces of the plurality of cavities 342-352. Other means for holding the resistors 306-316 may be used to keep the resistors 306-316 within the plurality of cavities 342-352. Of course, it should be appreciated that any number of resistors and corresponding cavities may be used.

Figure 12:
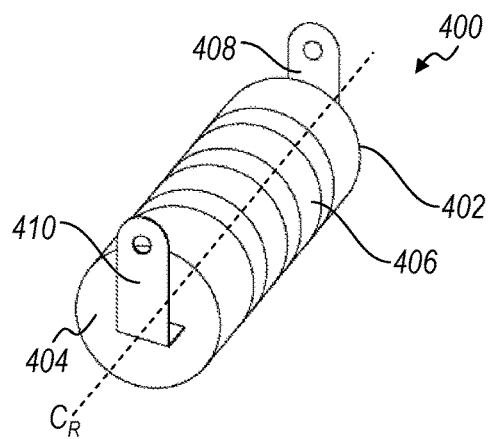
FIG. 12 is a perspective view of a resistor that may be used as a part of the third resistor-substrate configuration of FIG. 9.

FIG. 12 depicts a resistor 400 that may be used for each of the resistors 306-316 of the third resistor-substrate configuration 300. The resistor 400 is cylindrical and has a first end surface 402, a second end surface 404, and a cylindrical surface 406 that ends from the first end surface 402 to the second end surface 404. The resistor 400 includes a first electrical connector 408 that is provided on the first end surface 402 and a second electrical connector 410 that is provided on the second end surface 404. The first electrical connector 408 and the second electrical connector 410 can each be formed as a planar metal tab that extends away from the first end surface 402 and second end surface 404, respectively, along a central resistor axis CR. The planar metal tab is then bent at a right angle and extends radially away from the central resistor axis CR. The metal tabs each have a rounded end that includes a through-hole to facilitate connection to an electric wire (or other electric component).

Figure 13:
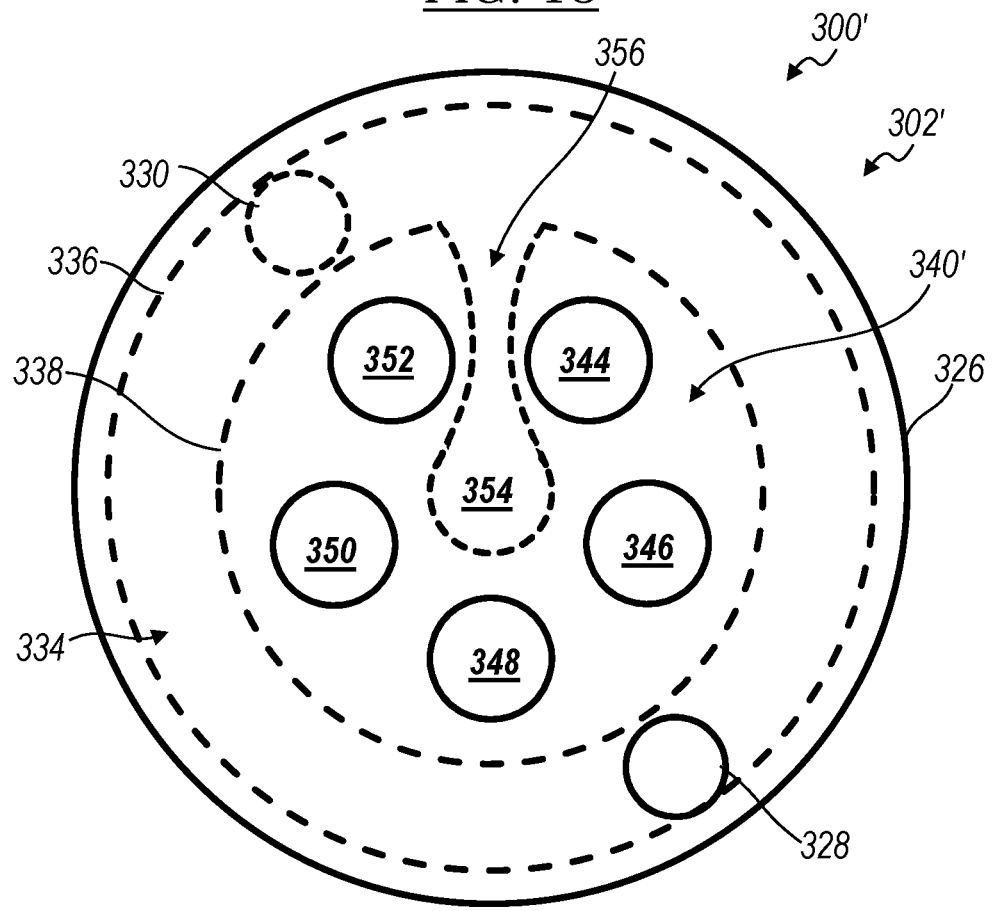
FIG. 13 is a front view of a substrate of a modified version of the third resistor-substrate configuration of FIG. 9.

With reference to FIG. 13, there is shown a modification of the third resistor-substrate configuration 300' in which the substrate 302' is different. It should be appreciated that FIG. 13 does not depict the resistors, however, the resistor 400 may be used as the resistors for the third resistor-substrate configuration 300'. In this modified configuration 300', the first resistor cavity 342 is omitted and the coolant path 332 further includes a central portion 354 that is in fluid communication with the other portions of the coolant path 332 via a leg portion 356. In the illustrated embodiment, the leg portion 356 extends through the entire inner portion 340 from the first end 318 to the second end 320. However, in other embodiments, two leg portions can be used, with a first leg portion located at the first end 318 and a second leg portion located at the second end 320.

Figure 14:
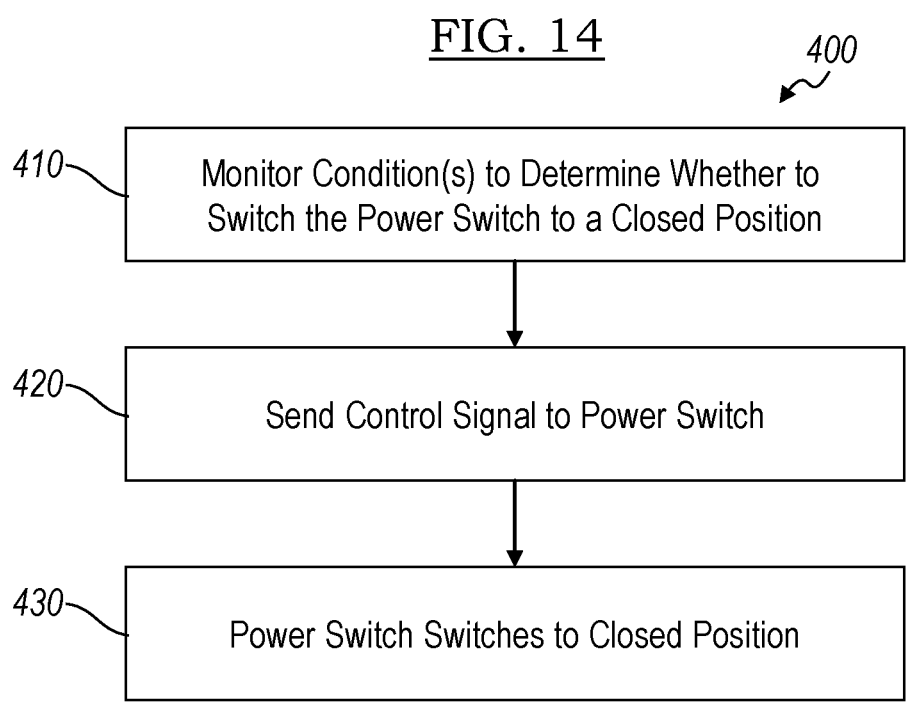
FIG. 14 is a flowchart depicting a method of dissipating electric power from an electrically-actuated turbocharger.

With reference to FIG. 14, there is shown a method 400 of dissipating electric power from an electrically-actuated turbocharger. The method 400 begins with step 410, wherein one or more conditions are monitored to determine whether to switch the power switch to a closed position. As discussed above, the electrically-actuated turbocharger 12 may generate excess electric power that may have undesirable effects on the power electronics and/or other components to which they are electrically coupled, or the turbocharger could be subjected to an unsafe over-speeding event. In one embodiment, the controller 48 monitors conditions that indicate excess electric power is being generated. The conditions may include any one or more of a shaft speed of the electrically-actuated turbocharger, a battery state of a vehicle battery (e.g., a current state of charge (SoC)) that is charged by the electrically-actuated turbocharger, and a battery charge capability of the vehicle battery (e.g., a maximum SoC value). For example, in one embodiment, the controller 48 obtains a current SoC of the vehicle battery, a threshold SoC value of the vehicle battery (e.g., a maximum SoC capability), and a shaft speed of the turbine shaft 26. In this example, the controller 48 then determines whether the current SoC exceeds (or is within a predetermined amount of) the threshold SoC value as well as whether the shaft speed of the turbine shaft 26 is above a predetermined amount. If the current SoC exceeds the threshold SoC value and the shaft speed of the turbine shaft 26 is above the predetermined amount, then it is determined to switch the power switch 44 to the closed state.

In such an example, the comparison of the shaft speed of the turbine shaft 26 to the predetermined amount may be used to obtain an indication of an over-speeding event. It should be appreciated that the predetermined amount may be any suitable value, and this value may be stored in the memory 56 of the controller 48 (or another suitable location, such as in memory of another controller). Moreover, at least in some embodiments, the predetermined amount may be modified as a part of an over-the-air (OTA) software update or through locally accessing the vehicle electronics, such as through an onboard diagnostics port (e.g., OBD II port); for example, the vehicle in which the electric power dissipater assembly 14 is installed may receive, at a main controller, an update having an updated predetermined amount from a device external from the vehicle (e.g., a remote server, an external OBD tool) and, then the main controller sends, using a Controller Area Network (CAN) bus (or other suitable network connection), the updated predetermined amount to the controller 48, which may then store this updated predetermined amount into memory 56. When an indication of an over-speeding event is obtained, the current SoC is compared to the threshold SoC value, which may be a maximum SoC value, to determine whether the vehicle battery is in a suitable state for receiving more electric charge. In this way, it can be determined whether electric power should be routed to the vehicle battery so as to charge the vehicle battery, or whether the electric power should be routed to the at least one resistor 46.

In another embodiment, the one or more conditions being monitored may be used to obtain an indication that the vehicle has crashed, which may be referred to as an indication of a vehicle crash event. For example, the one or more conditions may include determining loss of power to (or a failure of) certain vehicle components, detecting an acceleration being above a particular threshold amount and/or being in a particular direction, etc. In at least some embodiments, in response to obtaining an indication of a vehicle crash event, it may be desirable to dissipate power being used by the electrically-actuated turbocharger 12 even though an over-speeding event was not detected. In one instance, as a result of a vehicle crash event, the vehicle battery may become disconnected from the electrically-actuated turbocharger 12 and, in such a case, it may be determined to switch the power switch 44 to the closed position so that the power dissipater assembly 14 may dissipate power of the electrically-actuated turbocharger 12. The method 400 continues to step 420.

In step 420, the controller sends a control signal to the power switch thereby causing the power switch to switch to a closed state. It should be appreciated that the closed state of the power switch refers to a state in which the power switch electrically connects a first contact to a second contact allowing electrical current to flow, which may also be considered a conducting state. The controller 48 is electronically-coupled to the power switch 44 via a control signal path 52 as shown by the dotted line in FIG. 3. This control signal path 52 may or may not be an isolated signal path. The controller 48 generates a control signal that is configured so that, when the control signal is received by the power switch 44, the power switch is switched to the closed state. The method 400 continues to step 430.

In step 430, the power switch switches to the closed state in response to receiving the control signal from the controller. For example, upon receiving the control signal from the controller 48 via the control signal path 52, the power switch 44 switches to the closed state thereby electrically coupling the electric power output 42 to the at least one resistor 46.

Thus, when the power switch 44 is placed in the closed position, electric power provided by the electric power output 42 is received at and dissipated by the at least one resistor 46 in the form of heat. The method 400 then ends. Of course, it should be appreciated that the method 400 may be carried out numerous times and that the method 400 may restart at step 410 after having completed a previous iteration.

In some embodiments, the power dissipater assembly 14 may further include current-sensing capabilities (e.g., an ammeter) that is electrically-coupled to the at least one resistor 46 and that is able to measure current provided to the at least one resistor 46. The controller 48 may monitor this current by comparing the current to a current threshold amount and, when the current exceeds this current threshold amount, the controller may determine to open the power switch so as to prevent electric power from being received at the at least one resistor 46. In one embodiment, the controller 48 may take an amount of time into consideration in conjunction with the amount of current when determining whether to switch the power switch to the open position. This feature may be used, at least in some embodiments, to prevent the at least one resistor 46 from over-heating, which can lead to failure or deterioration of the at least one resistor 46.

According to various embodiments, any one or more of the steps of the method 400 may be embodied in computer instructions that are stored on the memory 56. In one embodiment, the processor 54 of the controller 48 executes the computer instructions to carry out one or more steps of the method 400, such as steps 410-420. In another embodiment, certain operations of the method 400 are carried out by one or more other controllers or electronics. For example, the monitoring of certain conditions (step 410) may be carried out by a second controller (not shown) and, upon certain conditions being met, the second controller sends an indication to the controller 48 that indicates that excess electric power is being generated or that the power switch is to be switched to the closed state.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. An electric power dissipater assembly for an electrically-actuated turbocharger, comprising:
a power switch configured to be electrically connected to an electric power output of the electrically-actuated turbocharger;
at least one resistor that is electrically connected to the power switch such that, when the power switch is in a closed position and connected to the electric power output, the at least one resistor is electrically coupled to the electric power output so that electric power provided by the electrical power output is received at and dissipated by the at least one resistor;
a controller that is electronically coupled to the power switch such that the controller controls whether the power switch is in the closed position or an open position; and
a substrate that includes an inlet port, an outlet port, and a coolant path that extends from the inlet port to the outlet port, wherein the substrate is physically coupled to the at least one resistor such that the at least one resistor is cooled when coolant is received within the coolant path.

2. The electric power dissipater assembly recited in claim 1, wherein the controller is configured to switch the power switch from the open position to the closed position in response to obtaining an indication of an over-speeding event, and wherein the indication of the over-speeding event is obtained based on a shaft speed or wheel speed of the electrically-actuated turbocharger.

3. The electric power dissipater assembly recited in claim 2, wherein the electric power output of the electrically-actuated turbocharger is electrically connected to a vehicle battery such that the vehicle battery is able to be charged by electric power received from the electric power output of the electrically-actuated turbocharger.

4. The electric power dissipater assembly recited in claim 3, wherein the controller is further configured to switch the power switch from the open position to the closed position in response to determining that the vehicle battery is above a predetermined charge amount.

5. The electric power dissipater assembly recited in claim 1, wherein the at least one resistor includes a first resistor physically coupled to a first side of the substrate and a second resistor physically coupled to a second side of the substrate that opposes the first side of the substrate such that the coolant path is disposed between the first resistor and the second resistor.

6. The electric power dissipater assembly recited in claim 5, wherein the first side and the second side each include a flat outer surface, and wherein the first resistor is physically coupled to the flat outer surface of the first side and the second resistor is physically coupled to the flat outer surface of the second side such that a portion of the substrate in which the coolant path is provided is sandwiched by the first resistor and the second resistor.

7. The electric power dissipater assembly recited in claim 6, wherein the first side of the substrate is a top side of the substrate and the second side of the substrate is a bottom side of the substrate, and wherein the inlet port and the outlet port are each provided at a peripheral side of the substrate that extends between the top side and the bottom side of the substrate.

8. The electric power dissipater assembly recited in claim 5, wherein the at least one resistor further includes a third resistor physically coupled to the first side of the substrate.

9. The electric power dissipater assembly recited in claim 1, wherein the at least one resistor and the substrate are housed in a housing, and wherein the housing is configured to be attached to an exterior portion of a bearing housing of the electrically-actuated turbocharger.

10. The electric power dissipater assembly recited in claim 9, wherein the inlet port is configured to be in fluid communication with a turbocharger liquid coolant path that is provided within the electrically-actuated turbocharger so as to cool a portion of the electrically-actuated turbocharger.

11. The electric power dissipater assembly recited in claim 9, wherein the inlet port is configured to be in fluid communication with an intake flow path of a compressor of the turbocharger so that air drawn into the intake flow path is used to cool the at least one resistor.

12. An electric power dissipater assembly for an electrically-actuated turbocharger, comprising:
 a power switch configured to be electrically connected to an electric power output of the electrically-actuated turbocharger;
 at least one resistor that is electrically connected to the power switch such that, when the power switch is in a closed position and connected to the electric power output, the at least one resistor is electrically coupled to the electric power output so that electric power provided by the electrical power output is received at and dissipated by the at least one resistor;
 a controller that is electronically coupled to the power switch such that the controller controls whether the power switch is in the closed position or an open position; and
 a substrate, including an inlet port, an outlet port, and a coolant path, having a radial thickness at least partially defining the coolant path, wherein the substrate is physically coupled to the at least one resistor such that the at least one resistor is cooled when coolant is received within the coolant path, and wherein the at least one resistor is positioned radially-inwardly relative to the radial thickness.

13. The electric power dissipater assembly recited in claim 12, wherein at least one cavity is at least partially defined by an inner portion of the substrate that is surrounded by a sleeve portion of the coolant path.

14. The electric power dissipater assembly recited in claim 13, wherein the sleeve portion of the coolant path has an annular shape about a central axis that is defined by a radially-inward-facing wall and a radially-outward-facing wall.

15. The electric power dissipater assembly recited in claim 12, wherein the at least one resistor is cylindrical.

16. The electric power dissipater assembly recited in claim 13, wherein the at least one cavity includes a first cavity that is cylindrical.

17. The electric power dissipater assembly recited in claim 16, wherein the at least one resistor includes a first resistor and a second resistor that is cylindrical, wherein the at least one cavity includes the first cavity and a second cavity that is cylindrical, and wherein the second resistor is provided within the second cavity.

18. The electric power dissipater assembly recited in claim 14, wherein the coolant path includes an axial portion that is provided along the central axis and within the inner portion of the substrate.

19. The electric power dissipater assembly recited in claim 16, wherein the first cavity is a cylindrical through hole that extends along a central axis from a first end to a second end of the substrate.

20. The electric power dissipater assembly recited in claim 12, wherein the at least one resistor and the substrate are included in a housing, and wherein the housing is configured to be attached to an exterior portion of a bearing housing of the electrically-actuated turbocharger.

* * * * *